United States Patent
Yu et al.

(10) Patent No.: US 12,261,215 B2
(45) Date of Patent: Mar. 25, 2025

(54) FIN ON SILICON-ON-INSULATOR

(71) Applicant: GlobalFoundries U.S. Inc., Malta, NY (US)

(72) Inventors: Hong Yu, Clifton Park, NY (US); Haiting Wang, Clifton Park, NY (US); Zhenyu Hu, Clifton Park, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 464 days.

(21) Appl. No.: 17/649,184

(22) Filed: Jan. 27, 2022

(65) Prior Publication Data
US 2023/0238452 A1    Jul. 27, 2023

(51) Int. Cl.
*H01L 29/78*     (2006.01)
*H01L 21/8234*   (2006.01)
*H01L 29/66*     (2006.01)

(52) U.S. Cl.
CPC ........... *H01L 29/66795* (2013.01); *H01L 21/823431* (2013.01); *H01L 29/785* (2013.01)

(58) Field of Classification Search
CPC ............ H01L 29/7851; H01L 29/785
See application file for complete search history.

(56) References Cited

U.S. PATENT DOCUMENTS

| | | | |
|---|---|---|---|
| 6,815,268 B1 * | 11/2004 | Yu | H01L 29/66795 438/164 |
| 7,071,064 B2 | 7/2006 | Doyle et al. | |
| 7,300,837 B2 | 11/2007 | Chen et al. | |
| 9,425,105 B1 * | 8/2016 | Basker | H01L 21/823821 |
| 10,181,429 B2 | 1/2019 | Costaganna et al. | |
| 10,438,858 B2 | 10/2019 | Bedell et al. | |
| 2008/0237577 A1 * | 10/2008 | Chui | H01L 29/165 438/151 |
| 2009/0072316 A1 * | 3/2009 | Topaloglu | H01L 29/785 257/E29.264 |
| 2011/0147711 A1 * | 6/2011 | Pillarisetty | B82Y 10/00 257/14 |
| 2012/0074386 A1 * | 3/2012 | Rachmady | H01L 29/267 438/296 |
| 2013/0032783 A1 * | 2/2013 | Pillarisetty | H01L 29/66431 257/29 |

(Continued)

FOREIGN PATENT DOCUMENTS

EP    3249689 B1    11/2017

*Primary Examiner* — Ida M Soward
(74) *Attorney, Agent, or Firm* — David Cain

(57) ABSTRACT

A structure is provided, the structure may include an active layer arranged over a buried oxide layer, the active layer having a top surface. The top surface of the active layer may have a first portion and a second portion. A barrier stack may be arranged over the first portion of the top surface of the active layer. The barrier stack may include a barrier layer. The second portion of the top surface of the active layer may be adjacent to the barrier stack. A fin may be spaced from the first portion of the top surface of the active layer by the barrier stack, the fin having a first side surface, a second side surface opposite to the first side surface and a top surface. A dielectric layer may be arranged on the first side surface, the second side surface and the top surface of the fin, and the second portion of the top surface of the active layer. A metal layer may be arranged over the dielectric layer.

17 Claims, 15 Drawing Sheets

(56) References Cited

U.S. PATENT DOCUMENTS

| | | | |
|---|---|---|---|
| 2017/0323942 A1* | 11/2017 | Voldman | H01L 29/1087 |
| 2018/0277652 A1* | 9/2018 | Park | H01L 21/76897 |
| 2019/0237580 A1* | 8/2019 | Bi | H01L 27/1211 |
| 2019/0296142 A1* | 9/2019 | Ebrish | H01L 21/823418 |
| 2023/0085838 A1* | 3/2023 | Zhang | H01L 21/84 |
| | | | 257/329 |

* cited by examiner

View X1-X1'

View X2-X2'

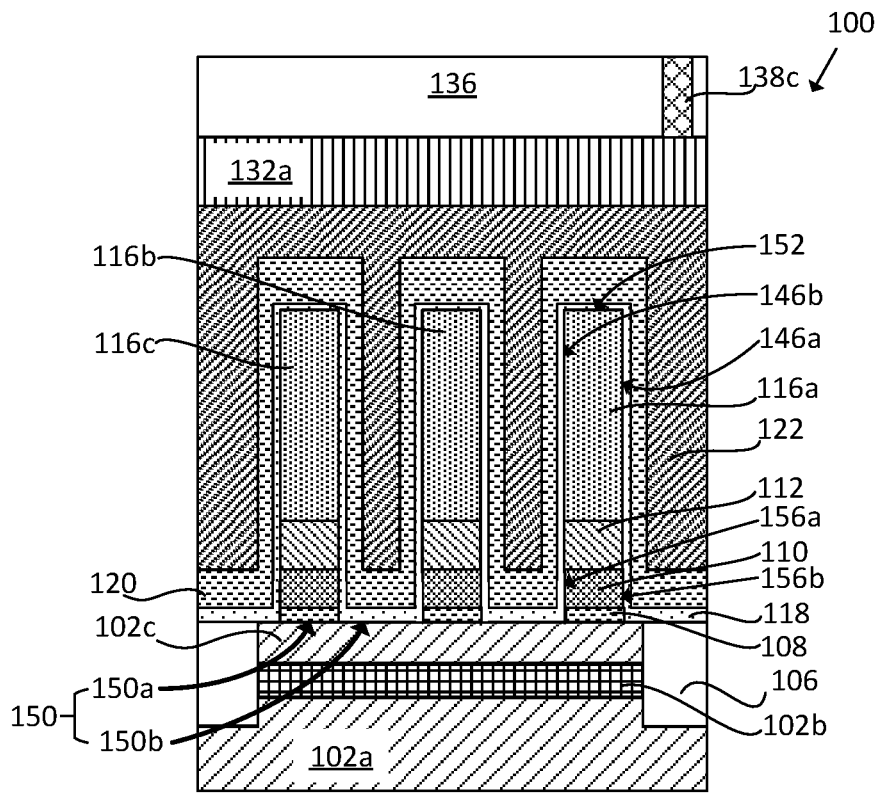
View Y1-Y1'    FIG. 1D
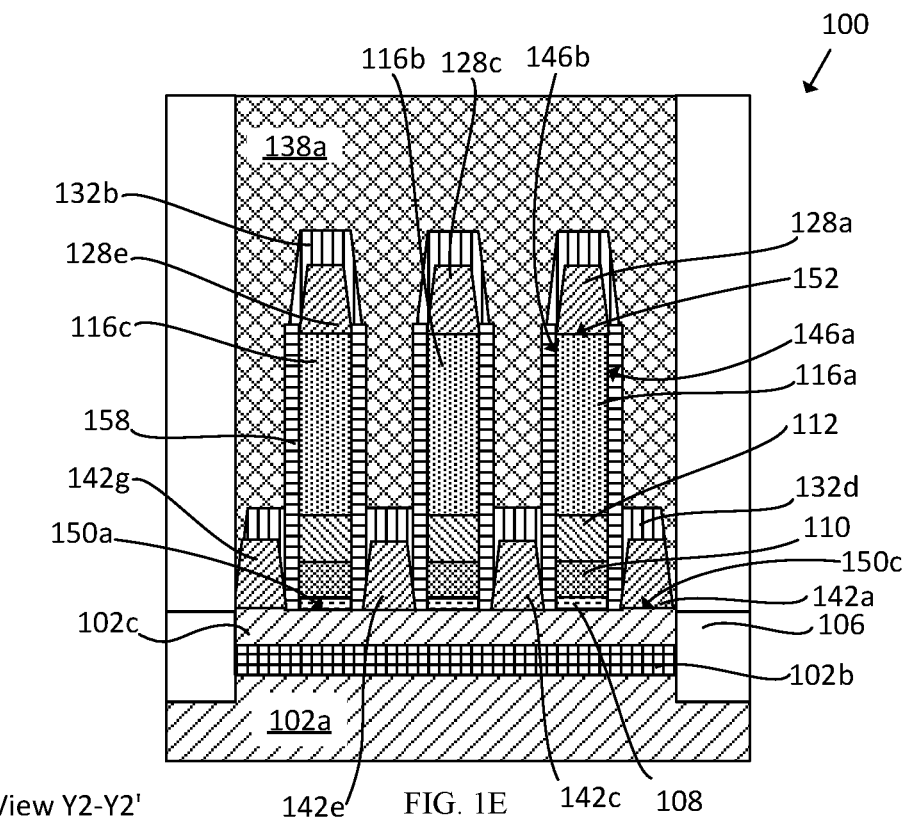
View Y2-Y2'    FIG. 1E

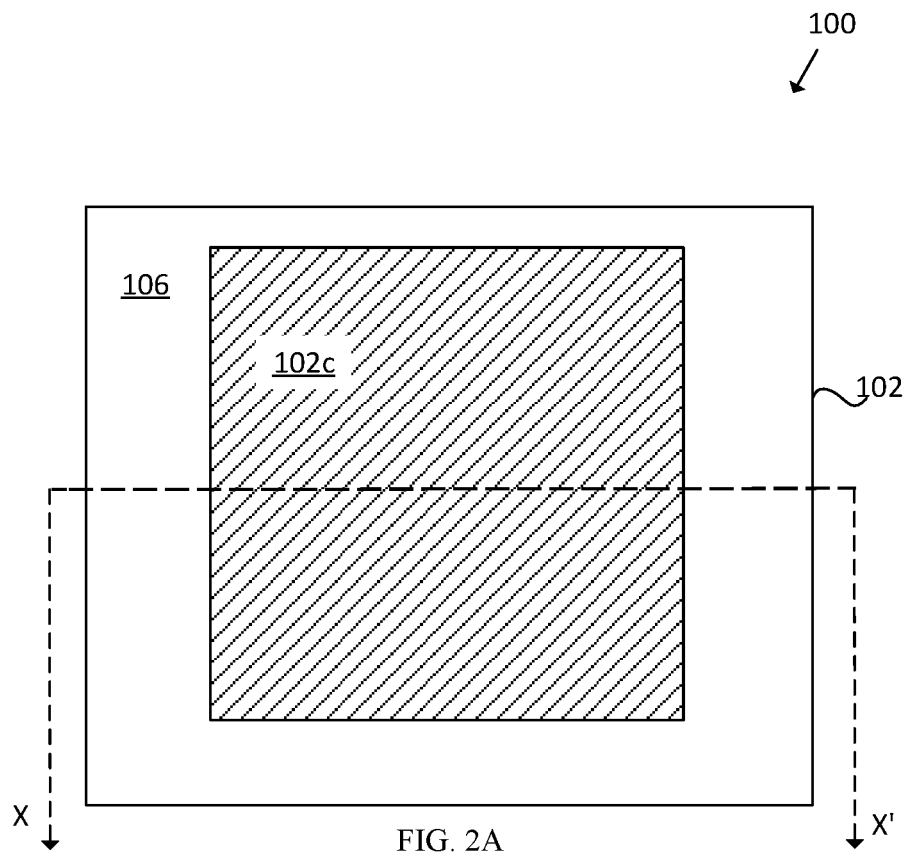
FIG. 2A
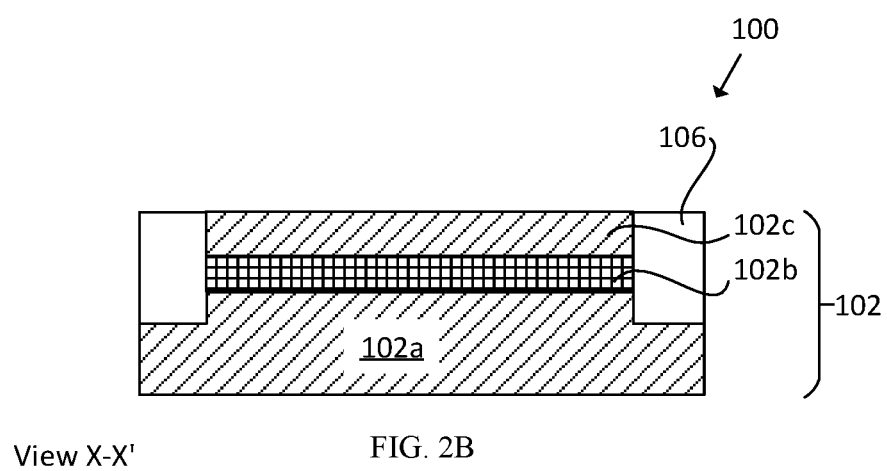
View X-X'  FIG. 2B

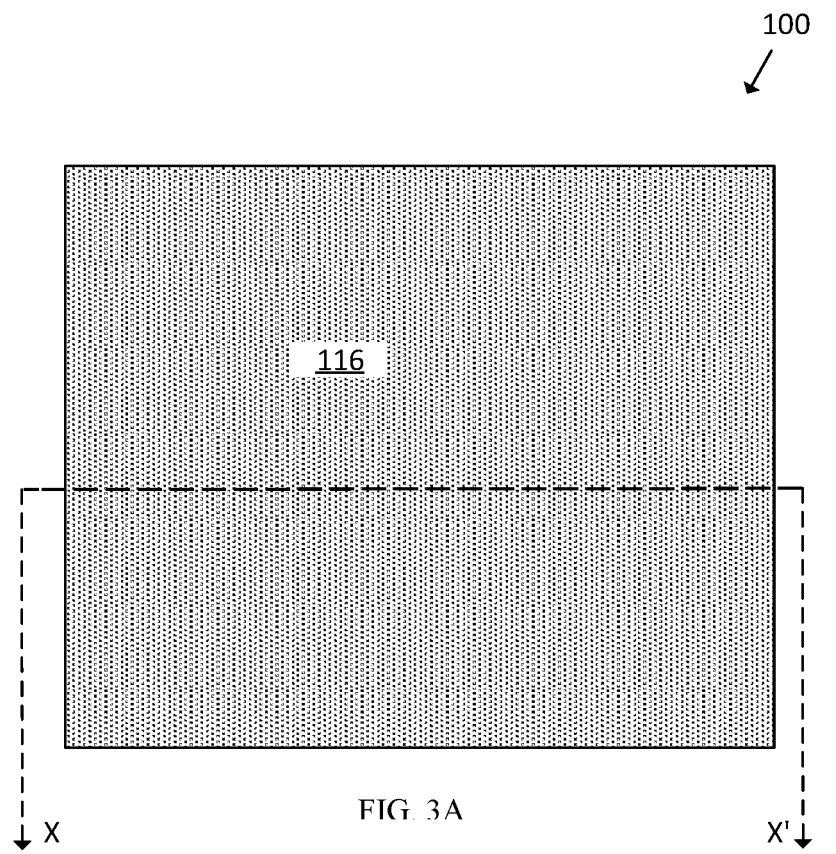
FIG. 3A
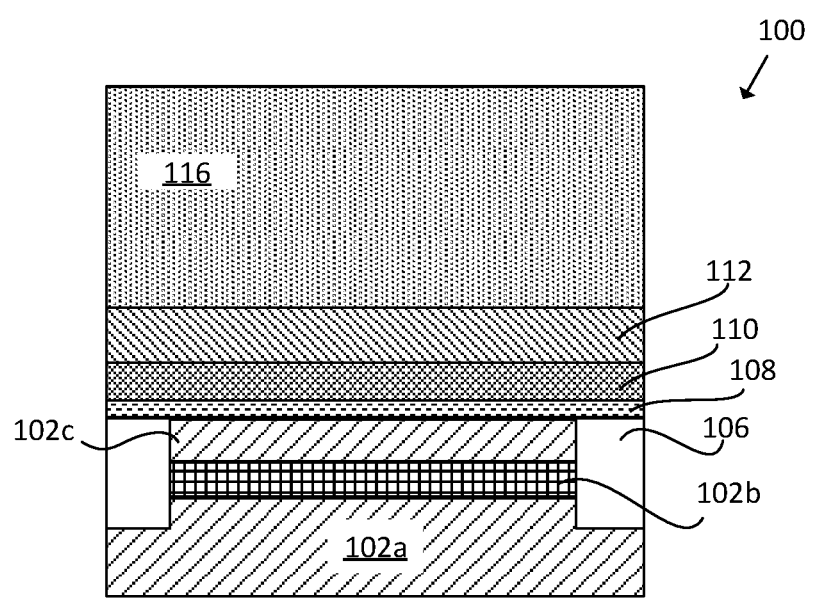
View X-X'  FIG. 3B

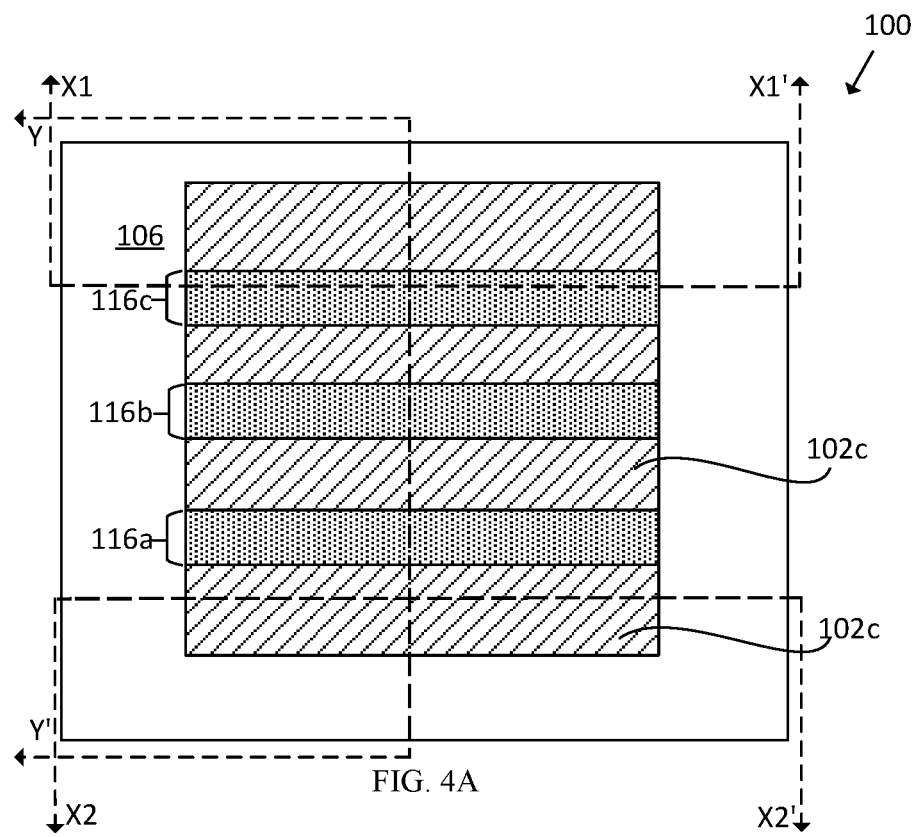
FIG. 4A
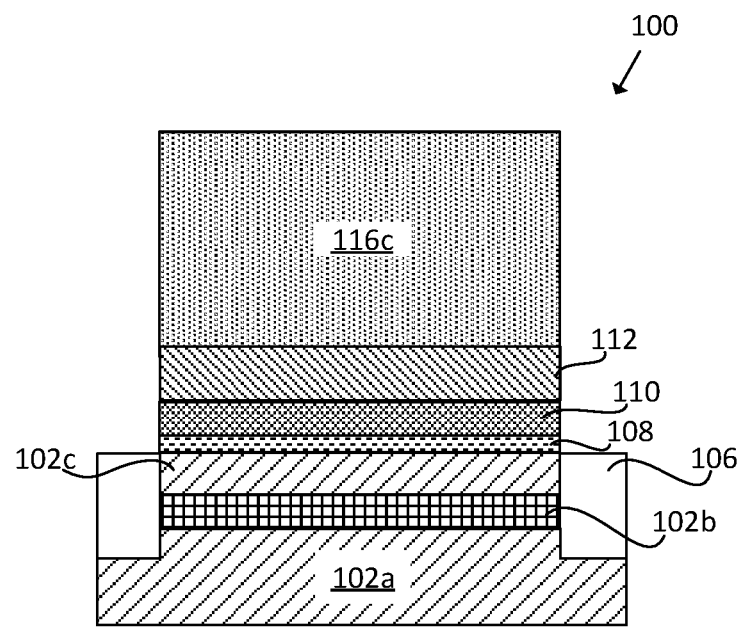
View X1-X1'  FIG. 4B

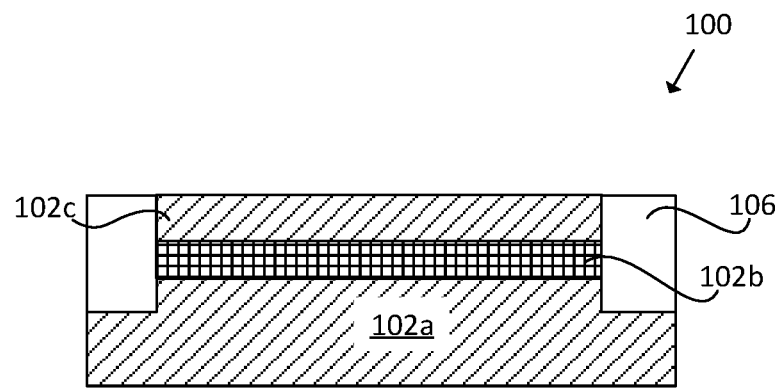
View X2-X2'  FIG. 4C
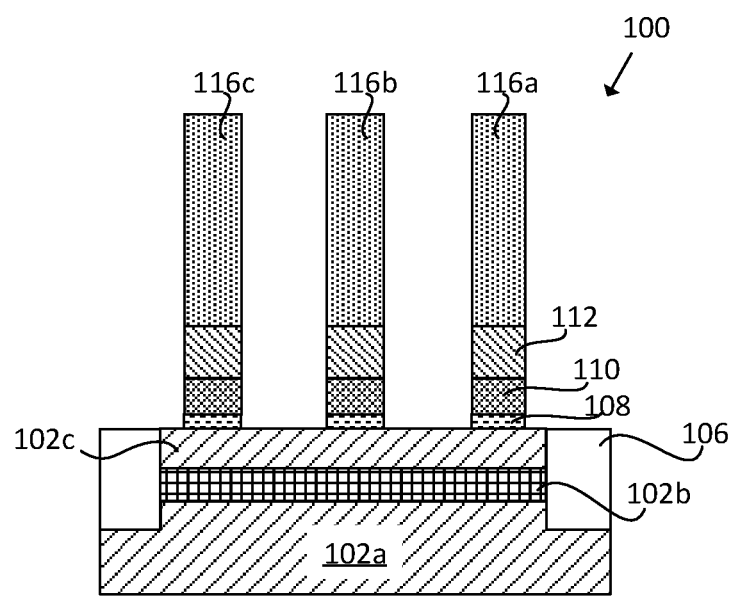
View Y-Y'  FIG. 4D

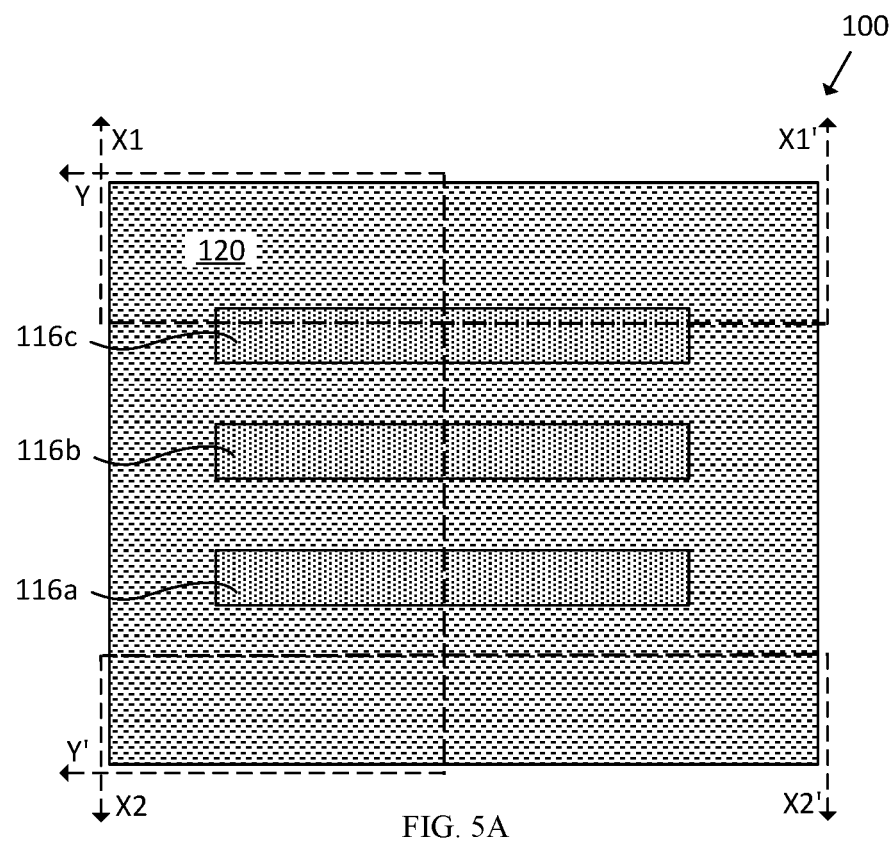
FIG. 5A
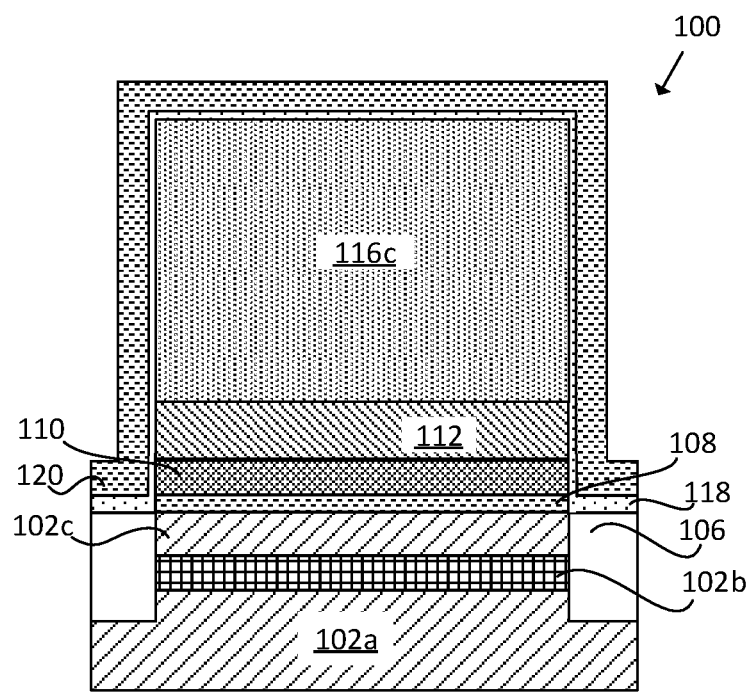
View X1-X1'  FIG. 5B

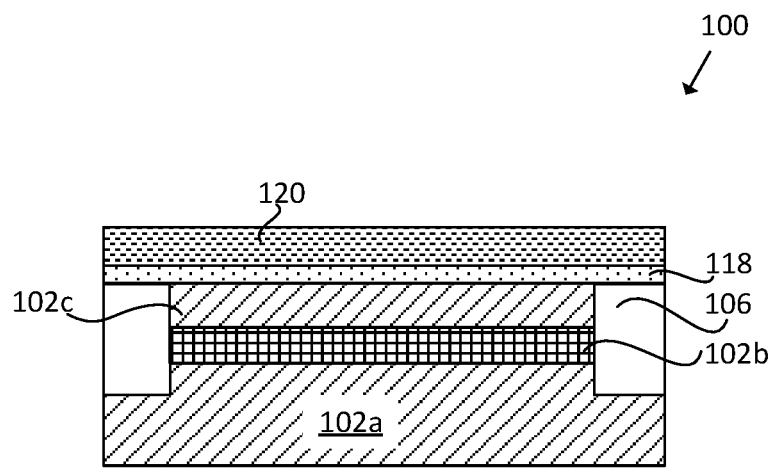
View X2-X2'    FIG. 5C
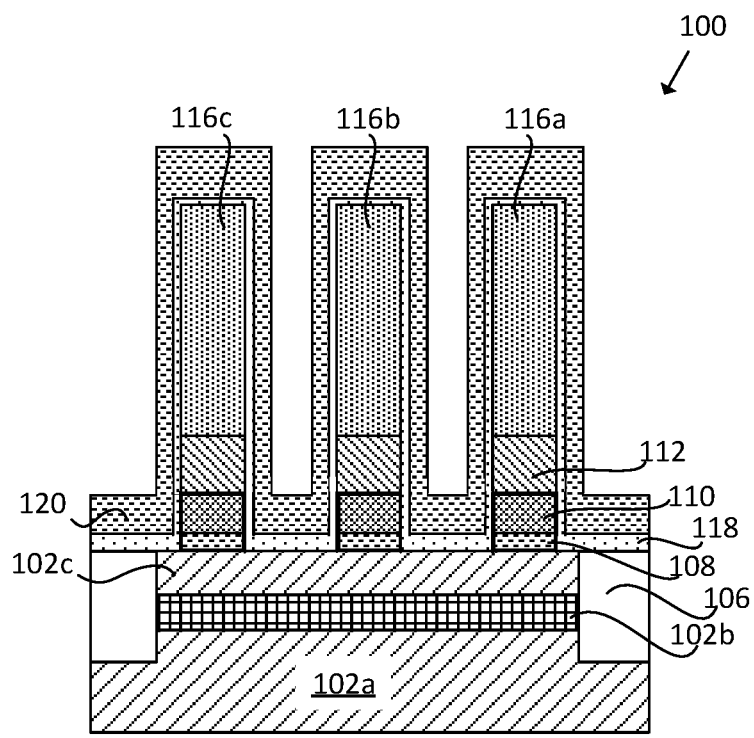
View Y-Y'    FIG. 5D

View X1-X1'

View X2-X2'

View Y-Y'

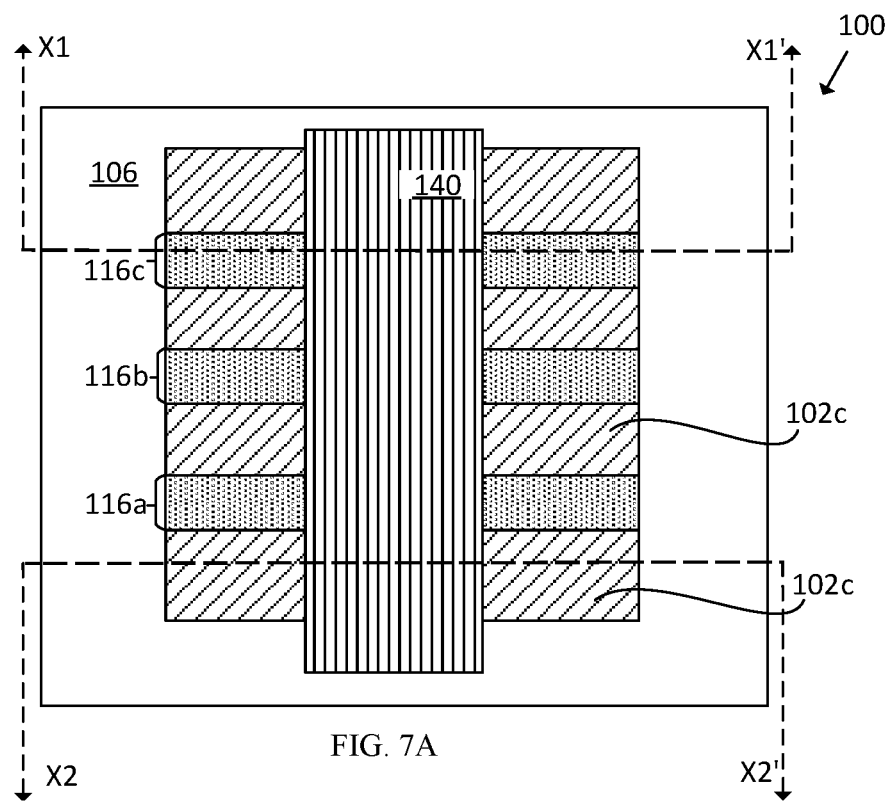
FIG. 7A
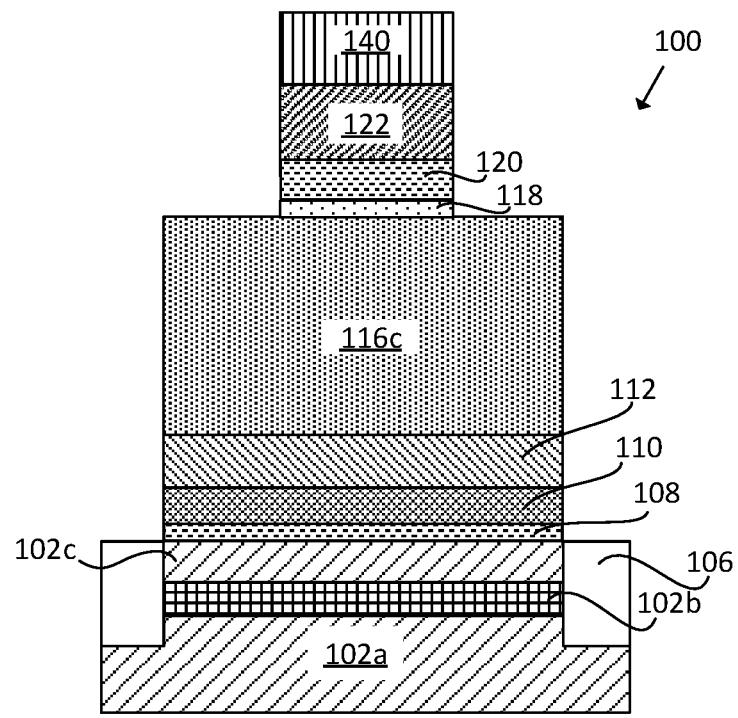
View X1-X1'  FIG. 7B

View X2-X2'

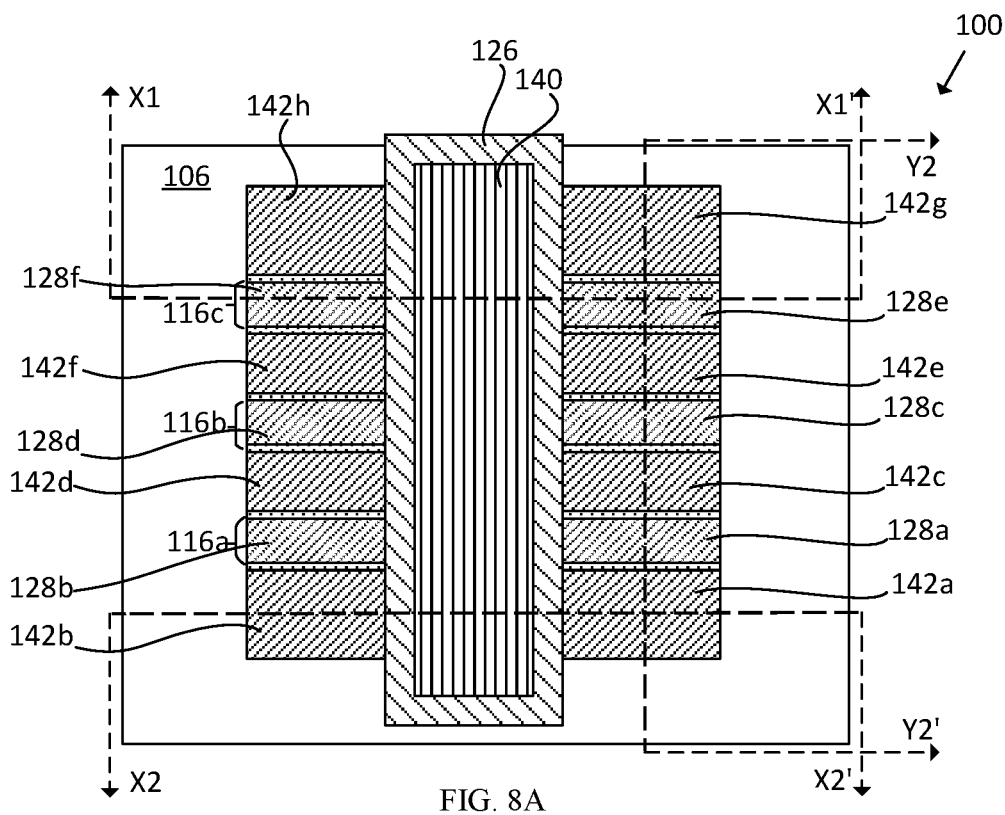
FIG. 8A
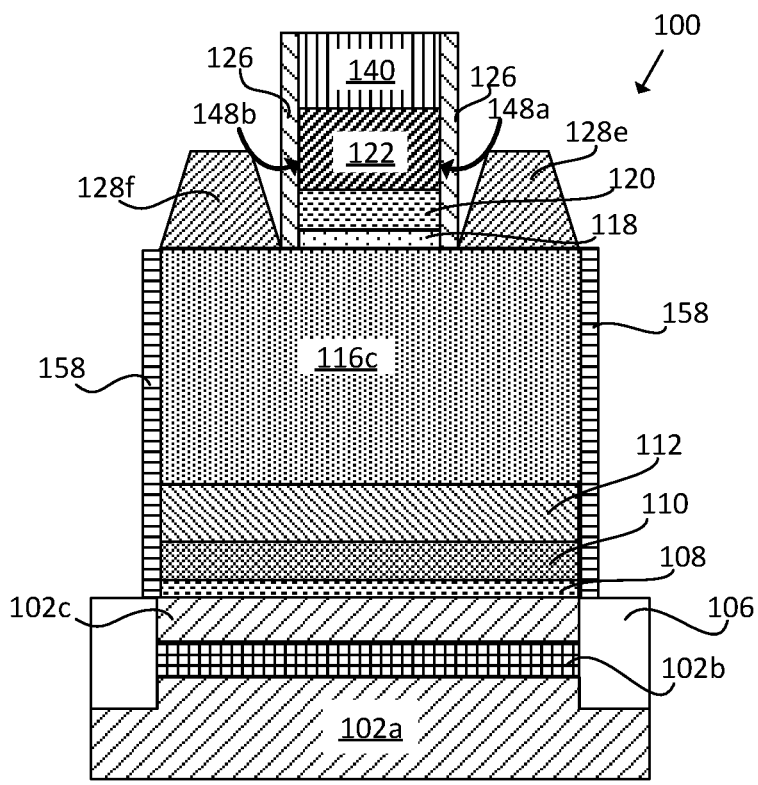
View X1-X1'  FIG. 8B

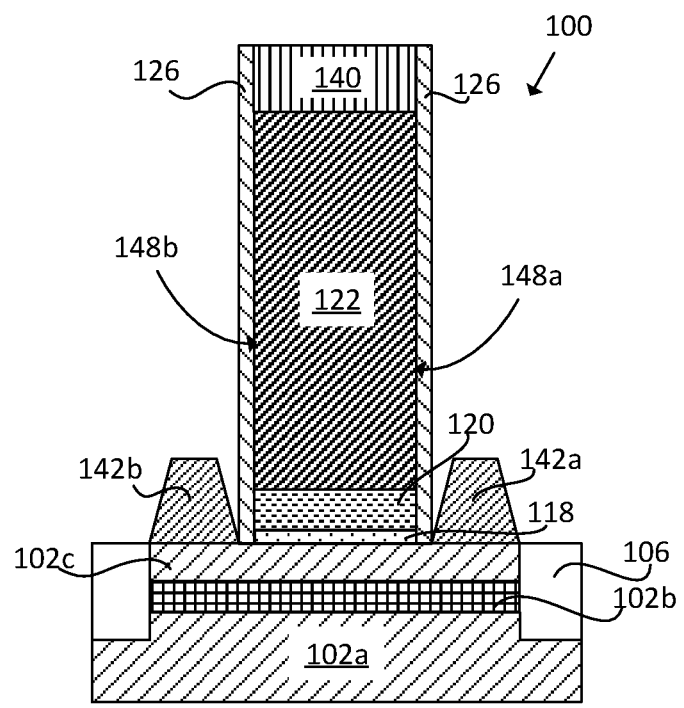
View X2-X2'    FIG. 8C
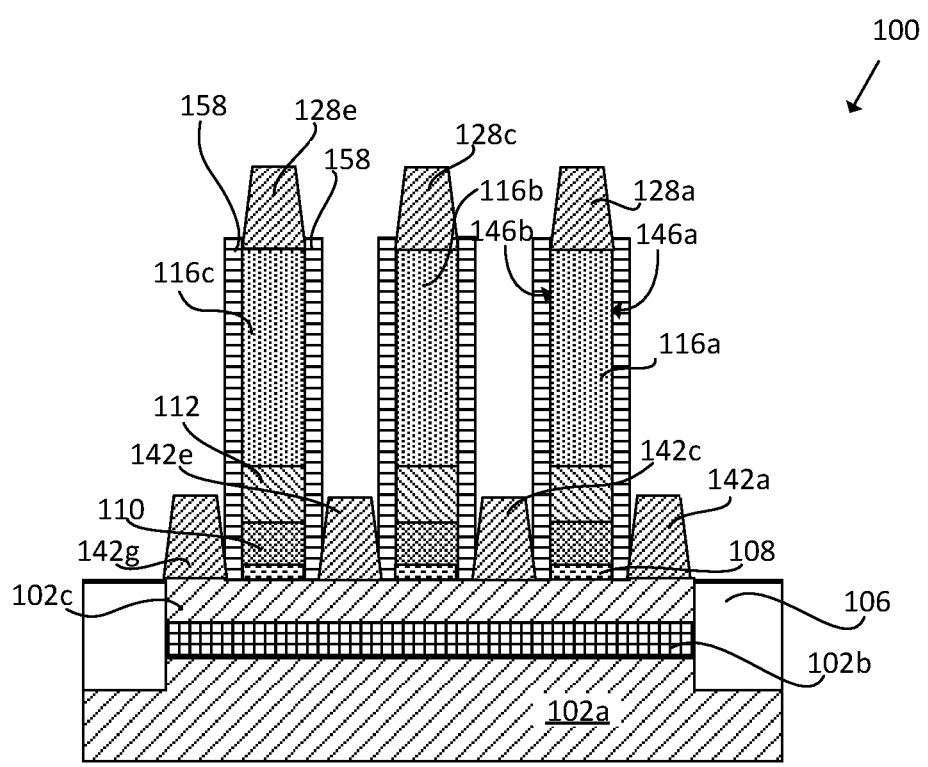
View Y2-Y2'    FIG. 8D

FIN ON SILICON-ON-INSULATOR

FIELD OF THE INVENTION

The disclosed embodiments relate generally to a semiconductor fin structure, and more particularly, to a semiconductor fin on a silicon on insulator (SOI) substrate and integration schemes.

BACKGROUND

Metal oxide semiconductor field effect transistors (MOSFETs), having a source, a drain, and a gate electrode, are commonly used in integrated circuit devices. MOSFETs may be fabricated on either a bulk semiconductor substrate or a silicon on insulator (SOI) substrate. The SOI substrate may include a thin active layer arranged over a buried oxide layer on top of a semiconductor layer. MOSFETs on an SOI substrate demonstrates improved device performance for high frequency application, for example, radio frequency (RF) application due to reduced parasitic capacitance. Additionally, back gate bias may be used to allow programmable threshold voltage control.

It is difficult to scale down the features of the MOSFETs on an SOI substrate. Additionally, MOSFETs on SOI substrate have a limited channel width leading to a lower device current. Thus, there is a need to overcome the challenges mentioned above.

SUMMARY

In an aspect of the present disclosure, a structure is provided. The structure comprises an active layer arranged over a buried oxide layer, the active layer having a top surface. The top surface of the active layer having a first portion and a second portion. A barrier stack may be arranged over the first portion of the top surface of the active layer. The barrier stack may include a barrier layer. The second portion of the top surface of the active layer may be adjacent to the barrier stack. A fin may be spaced from the first portion of the top surface of the active layer by the barrier stack, the fin having a first side surface, a second side surface opposite to the first side surface and a top surface. A dielectric layer may be arranged on the first side surface, the second side surface and the top surface of the fin, and the second portion of the top surface of the active layer. A metal layer may be arranged over the dielectric layer.

In another aspect of the present disclosure, a structure is provided. The structure comprises an active layer arranged over a buried oxide layer, the active layer having a top surface. The top surface of the active layer having a first portion and a second portion. A barrier stack may be arranged over the first portion of the top surface of the active layer. The barrier stack may include a conductive layer and a barrier layer over the conductive layer. The conductive layer having a first side surface and a second side surface opposite to the first side surface. The second portion of the top surface of the active layer may be adjacent to the barrier stack. A fin may be spaced from the first portion of the top surface of the active layer by the barrier stack. The fin having a first side surface, a second side surface opposite to the first side surface and a top surface. A dielectric layer may be arranged on the first side surface of the fin and the top surface of the fin, the first side surface of the conductive layer, the second side surface of the conductive layer, and the second portion of the top surface of the active layer. A gate metal layer may be arranged over the dielectric layer.

In yet another aspect of the present disclosure, a method of fabricating a structure is provided. The method comprises forming a barrier stack over a first portion of a top surface of an active layer. The barrier stack including a barrier layer. Whereby the active layer may be arranged over a buried oxide layer and a second portion of the top surface of the active layer may be adjacent to the barrier stack. A fin may be formed, whereby the fin may be spaced from the first portion of the top surface of the active layer by the barrier stack, the fin having a first side surface, a second side surface opposite to the first side surface and a top surface. A dielectric layer may be formed on the first side surface, the second side surface and the top surface of the fin, and the second portion of the top surface of the active layer. A metal layer may be formed over the dielectric layer.

BRIEF DESCRIPTION OF THE DRAWINGS

The disclosed embodiments will be better understood from a reading of the following detailed description, taken in conjunction with the accompanying drawings:

FIG. 1D illustrates a cross-sectional view of the structure taken along section line Y1-Y1' of FIG. 1A, according to an embodiment of the disclosure.

FIG. 1E illustrates a cross-sectional view of the structure taken along section line Y2-Y2' of FIG. 1A, according to an embodiment of the disclosure.

FIGS. 2A and 2B to 8A to 8D illustrate a fabrication process flow for the structure shown in FIGS. 1A to 1E, according to some embodiments of the disclosure.

Figure 1A:
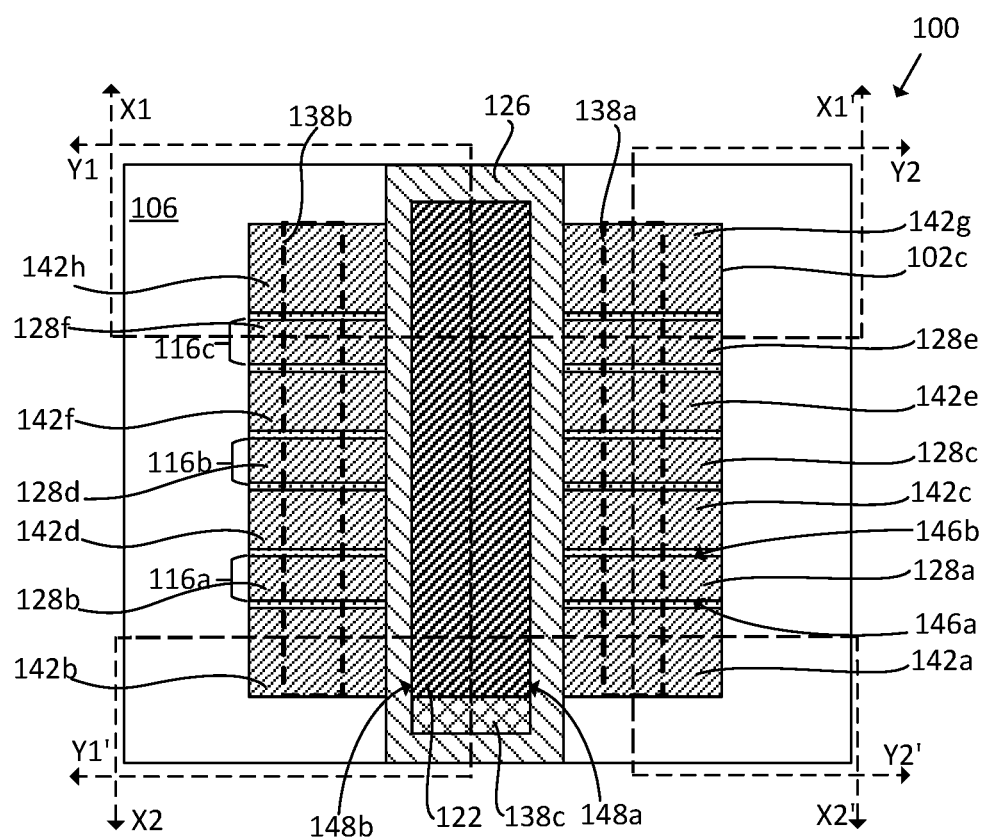
FIG. 1A illustrates a top view of a structure, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the devices. Additionally, elements in the drawings are not necessarily drawn to scale. For example, the dimensions of some of the elements in the drawings may be exaggerated relative to other elements to help improve understanding of embodiments of the devices. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

FIG. 1A illustrates a top view of a structure 100, according to an embodiment of the disclosure. In one embodiment, the structure 100 may be a fin-type transistor, for example, a fin-type field effect transistor. In one embodiment, the structure 100 may be a planar and a fin-type field effect transistor. Referring to FIG. 1A, fins 116a, 116b and 116c may be arranged over an active layer 102c. The fins 116a, 116b and 116c may be spaced from each other. The active layer 102c may be surrounded by an isolation structure 106. The isolation structure 106 may be a shallow trench isolation. A polysilicon layer 122 may be arranged over and traversing across the fins 116a, 116b and 116c and the active layer 102c. The polysilicon layer 122 may have a first side surface 148a and a second side surface 148b opposite to the first side surface 148a. A spacer 126 may be arranged along a periphery of the polysilicon layer 122, for example, the spacer 126 may be arranged next to the first 148a and second 148b side surfaces. In one embodiment, the polysilicon layer 122 may be a gate polysilicon layer. An epitaxial structure 142a may be arranged on the active layer 102c and laterally spaced from the first side surface 148a of the polysilicon layer 122. An epitaxial structure 142b may be arranged on the active layer 102c and laterally spaced from the second side surface 148b. A fin epitaxial structure 128a may be arranged over a portion of the fin 116a and laterally spaced from the first side surface 148a of the polysilicon layer 122. A fin epitaxial structure 128b may be arranged over another portion of the fin 116a and laterally spaced from the second side surface 148b of the polysilicon layer 122. Fin epitaxial structures 128c and 128d may be arranged over fin 116b and laterally spaced from the first 148a and second 148b side surfaces, respectively. Fin epitaxial structures 128e and 128f may be arranged over fin 116c and laterally spaced from the first 148a and second 148b side surfaces, respectively.

The fin 116a may have a first side surface 146a and a second side surface 146b opposite to the first side surface 146a. The epitaxial structures 142a and 142b may be arranged laterally spaced from the first side surface 146a of the fin 116a. An epitaxial structure 142c may be arranged on the active layer 102c and laterally spaced from the second side surface 146b of the fin 116a and the first side surface 148a of the polysilicon layer 122. An epitaxial structure 142d may be arranged laterally spaced from the second side surface 146b of the fin 116a and the second side surface 148b of the polysilicon layer 122. The epitaxial structures 142c and 142d may be arranged between the fins 116a and 116b. Epitaxial structures 142e and 142f may be arranged between the fins 116b and 116c and laterally spaced from a first side surface of the fin 116c. Epitaxial structures 142g and 142h may be laterally spaced from a second side surface of the fin 116c. The second side surface of the fin 116c may be arranged opposite to the first side surface. For simplicity, silicide layers above the epitaxial structures 142a to h, fin epitaxial structures 128a to f and the polysilicon layer 122 are not shown in this top down view. A contact electrode 138a may be arranged over the epitaxial structures 142a, 142c, 142e, and 142g, and the fin epitaxial structures 128a, 128c, and 128e. A contact electrode 138b may be arranged over the epitaxial structures 142b, 142d, 142f, and 142h and the fin epitaxial structures 128b, 128d, and 128f. The contact electrodes 138a and 138b may be continuous structures and are illustrated as dashed outlines.

Figure 1B:
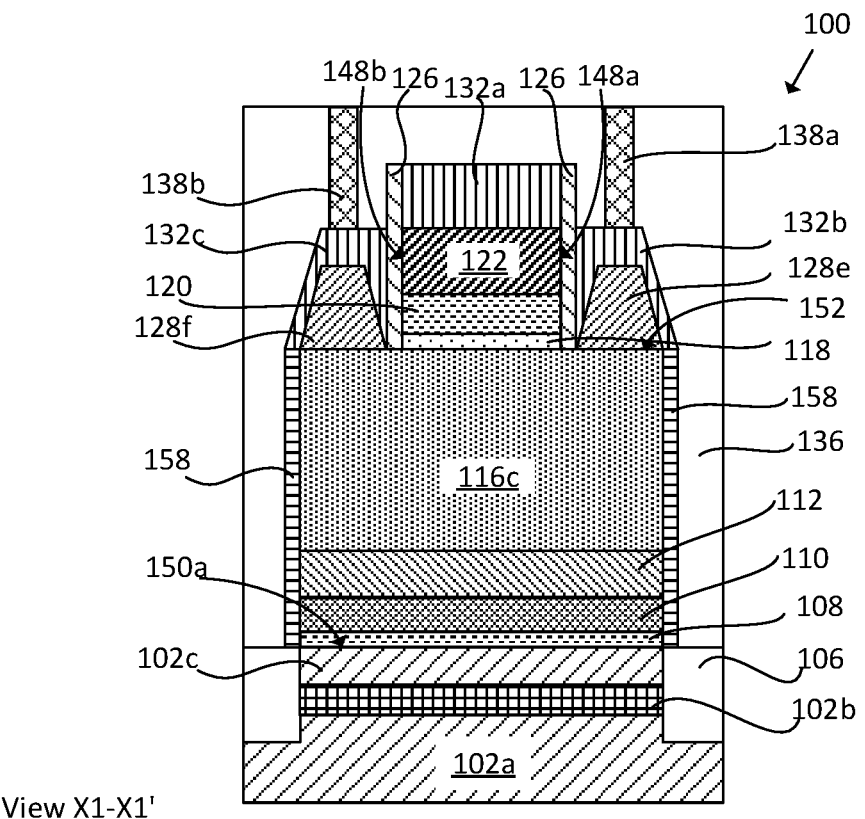
FIG. 1B illustrates a cross-sectional view of the structure taken along section line X1-X1' of FIG. 1A, according to an embodiment of the disclosure.

FIG. 1B illustrates a corresponding cross-sectional view of the structure 100 taken along section line X1-X1' of FIG. 1A, according to an embodiment of the disclosure. Referring to FIG. 1B, the structure 100 may include a semiconductor layer 102a and a buried oxide layer 102b arranged over the semiconductor layer 102a. The active layer 102c may be arranged over the buried oxide layer 102b. The semiconductor layer 102a, buried oxide layer 102b and active layer 102c may be a silicon on insulator substrate. The isolation structure 106 may be arranged laterally adjacent to the active layer 102c, buried oxide layer 102b and over the semiconductor layer 102a. The active layer 102c may have a top surface 150. An insulating layer 108 may be arranged over a portion 150a of the top surface 150 of the active layer 102c. In one embodiment, the insulating layer 108 may be directly contacting the portion 150a. A conductive layer 110 may be arranged over a top surface of the insulating layer 108. In one embodiment, the conductive layer 110 may be directly contacting the top surface of the insulating layer 108. A barrier layer 112 may be arranged over a top surface of the conductive layer 110. In one embodiment, the barrier layer 112 may be directly contacting the top surface of the conductive layer 110. The insulating layer 108, conductive layer 110 and barrier layer 112 may be referred to as a barrier stack. The fin 116c may be arranged over a top surface of the barrier layer 112. In one embodiment, a bottom surface of the fin 116c may be directly contacting the top surface of the barrier layer 112. The fin 116c may be spaced from the portion 150a by the barrier stack. The fin 116c may have a top surface 152. A dielectric layer 118 may be arranged on a portion of the top surface 152 and a metal layer 120 may be arranged over a top surface of the dielectric layer 118. In one embodiment, the metal layer 120 may be directly contacting the top surface of the dielectric layer 118. In one embodiment, the metal layer 120 may be a gate metal layer. The polysilicon layer 122 may be arranged over a top surface of the metal layer 120. In one embodiment, the polysilicon layer 122 may be directly contacting the top surface of the metal layer 120. The fin epitaxial structure 128e may be arranged on another portion different from the previous portion of the top surface 152 of the fin 116c and laterally spaced from the first side surface 148a of the polysilicon layer 122. The fin epitaxial structure 128f may be arranged on yet another portion different from the previous portions of the top surface 152 and laterally spaced from the second side surface 148b of the polysilicon layer 122. The spacer structures 126 may be arranged on the first 148a and second 148b side surfaces, and side surfaces of the metal layer 120 and the dielectric layer 118. The spacer structures 126 may separate the polysilicon layer 122, the metal layer 120 and the dielectric layer 118 from the fin epitaxial structures 128e and 128f. Fin spacer structures 158 may be arranged on side surfaces of the fin 116c, barrier layer 112, conductive layer 110 and insulating layer 108. Silicide layers 132a, 132b and 132c may be arranged over the polysilicon layer 122 and fin epitaxial structures 128e and 128f, respectively. Contact electrodes 138a and 138b may be arranged over the silicide layers 132b and 132c, respectively. An interlayer dielectric (ILD) 136 layer may be arranged over the isolation structure 106, the fin 116c, silicide layers 132a to c and contact electrodes 138a and 138b.

Figure 1C:
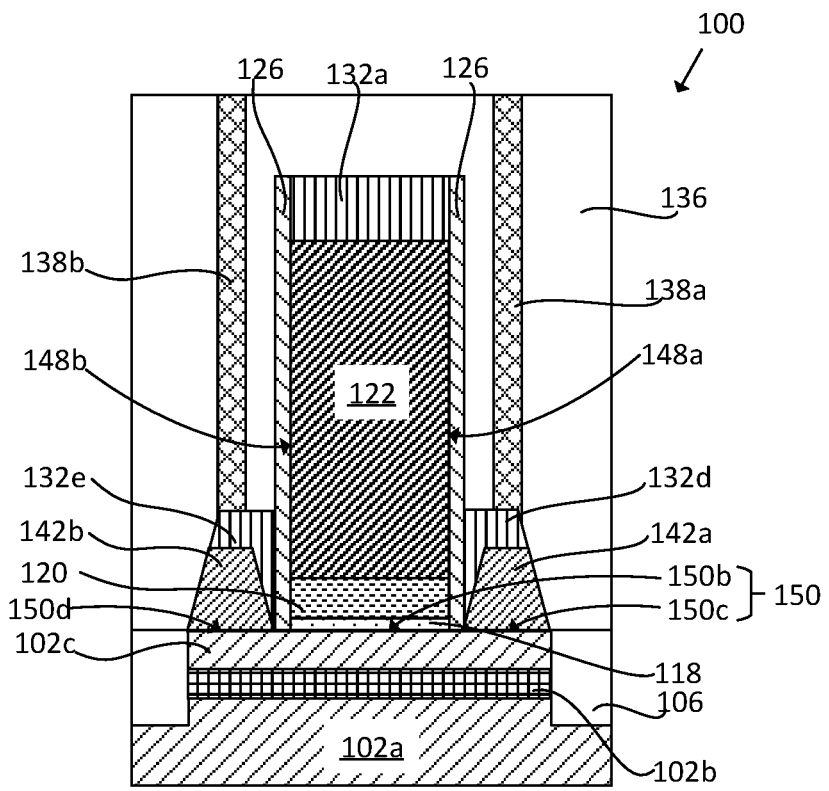
FIG. 1C illustrates a cross-sectional view of the structure taken along section line X2-X2' of FIG. 1A, according to an embodiment of the disclosure.

FIG. 1C illustrates a corresponding cross-sectional view of the structure 100 taken along section line X2-X2' of FIG. 1A, according to an embodiment of the disclosure. Referring to FIG. 1C, a portion of the dielectric layer 118 may be arranged on a portion 150b of the top surface 150 of the active layer 102c. The metal layer 120, may be arranged over the dielectric layer 118 and the polysilicon layer 122 may be arranged over the metal layer 120. The epitaxial structure 142a may be arranged on a portion 150c of the top surface 150 of the active layer 102c and laterally spaced from the first 148a side surface of the polysilicon layer 122. The epitaxial structure 142b may be arranged on a portion 150d of the top surface 150 of the active layer 102c and laterally spaced from the second side surface 148b of the polysilicon layer 122. Silicide layers 132d and 132e may be arranged on the epitaxial structures 142a and 142b, respectively. The contact electrodes 138a and 138b may be arranged on the silicide layers 132d and 132e, respectively.

FIG. 1D illustrates a corresponding cross-sectional view of the structure 100 taken along section line Y1-Y1' of FIG. 1A, according to an embodiment of the disclosure. Referring to FIG. 1D, in one embodiment, the insulating layer 108 may be arranged on the portion 150a of the top surface 150 of the active layer 102c, the conductive layer 110 may be arranged over the insulating layer 108 and the barrier layer 112 may be arranged over the conductive layer 110. The fins 116a, 116b and 116c may be arranged over the barrier layer 112. In another embodiment, the barrier layer 112 may be arranged on the portion 150a of the top surface 150 of the active layer 102c, in direct contact with the portion 150a. The dielectric layer 118 may be conformally arranged over each of the fins 116a, 116b and 116c. In one embodiment, the dielectric layer 118 may directly contact the first side surface 146a, a top surface 152 and second side surface 146b of the fin 116a. The dielectric layer 118 may extend to cover the side surfaces of the barrier layer 112 and over a portion 150b of the top surface 150 between the fins 116a, 116b and 116c. The portion 150b may be adjacent to the insulating layer 108. The dielectric layer 118 may be laterally adjacent to the insulating layer 108. The dielectric layer 118 may also be arranged on the side surfaces and top surfaces of the fins 116b and 116c. In one embodiment, the conductive layer 110 may have side surfaces, for example, a first side surface 156a and a second side surface 156b opposite to the first side surface 156a. In yet another embodiment, the dielectric layer 118 may extend to cover the first 156a and second 156b side surfaces of the conductive layer 110. The metal layer 120 may be arranged on the dielectric layer 118. In one embodiment, the metal layer 120 over the fins 116a to 116c and over the portion 150b of the top surface 150 of the active layer 102c laterally adjacent to the fins 116a to 116c may be a continuous structure. In one embodiment, the metal layer 120 may extend to cover the dielectric layer 118 on the side surfaces of the barrier layer 112 and the conductive layer 110, with the dielectric layer 118 separating the metal layer 120 from the conductive layer 110. In another embodiment, the metal layer 120 may be in direct contact with the conductive layer 110, for example, the metal layer 120 may be arranged on the first 156a and second 156b side surfaces of the conductive layer 110. The polysilicon layer 122 may be arranged on the metal layer 120. A gate contact electrode 138c may be arranged on the silicide layer 132a over the polysilicon layer 122. The interlayer dielectric layer 136 may be arranged over the silicide layer 132a and the gate contact electrode 138c.

During device operation, a bias may be applied to the contact electrode 138a and the gate contact electrode 138c while the contact electrode 138b may be grounded. A back-gate bias may also be applied to the semiconductor layer 102a. In one embodiment, charge carriers may be generated in a channel region next to the side surfaces and top surfaces of the fins 116a to c and below the portion 150b of the top surface 150 of the active layer 102c laterally adjacent to the fins 116a to c, leading to a large drive current. In another embodiment, charge carriers may also be generated below the portion 150a of the top surface of the active layer 102c directly below the fins 116a to c, further improving the drive current. For example, the charge carriers may be generated directly below the fins 116a to c when the metal layer 120 is in direct contact with the conductive layer 110.

FIG. 1E illustrates a corresponding cross-sectional view of the structure 100 taken along section line Y2-Y2' of FIG. 1A, according to an embodiment of the disclosure. Referring to FIG. 1E, fin spacer structures 158 may be arranged on the side surfaces of the fins 116a, 116b and 116c. The fin spacer structures 158 may extend over side surfaces of the barrier layer 112, conductive layer 110 and the insulating layer 108. The epitaxial structures 142a, 142c, 142e and 142g may be arranged on the portion 150c of the top surface 150 of the active layer 102c. The fin 116a may be arranged between the epitaxial structures 142a and 142c. The fin 116b may be arranged between the epitaxial structures 142c and 142e. The fin 116c may be arranged between the epitaxial structures 142e and 142g. The fin spacer structures 158 may separate the epitaxial structures 142a and 142c from the insulating layer 108, conductive layer 110, barrier layer 112 and the fin 116a. The fin spacer structures 158 may separate the epitaxial structures 142c and 142e from the fin 116b. The fin spacer structures 158 may separate the epitaxial structures 142e and 142g from the fin 116c. Fin epitaxial structures 128a, 128c and 128e may be arranged on the top surfaces of the fins 116a, 116b and 116c, respectively. Silicide layers may be formed on the epitaxial structures 142a, 142c, 142e and 142g and fin epitaxial structures 128a, 128c and 128e. The contact electrode 138a may be arranged on the silicide layers and over the fins 116a, 116b, and 116c.

The semiconductor layer 102a may be made of a suitable semiconductor material, for example, silicon. In one embodiment, the semiconductor layer 102a may be doped with a suitable n-type dopant, for example, arsenic, phosphorus, or antimony. The buried oxide layer 102b may be made of a suitable dielectric material, for example, silicon dioxide. The active layer 102c may be made of a suitable semiconductor material, for example, silicon. In one embodiment, the active layer 102c may be doped with boron or any other suitable p-type dopants. The isolation structure 106 may be made of a suitable dielectric material, for example, silicon dioxide. The insulating layer 108 may be made of a suitable dielectric material, for example, silicon dioxide, silicon nitride, high dielectric constant material for example hafnium oxide, aluminum oxide or any other suitable dielectric materials. The term "high dielectric constant material" may refer to a dielectric material having a dielectric constant greater than 7. The conductive layer 110 may be made of a suitable conductive material, for example, titanium nitride, titanium, titanium aluminide or any other suitable conductive materials. The barrier layer 112 may be made of a suitable dielectric material, for example, silicon dioxide, silicon nitride, or any other suitable dielectric materials. The fins 116a to c may be made of a suitable semiconductor material, for example, polysilicon, or any other suitable semiconductor materials. In one embodiment, the dielectric layer 118 may be made of silicon dioxide. In another embodiment, the dielectric layer 118 may be made of a suitable dielectric material, for example, silicon nitride, high dielectric constant materials, or any other suitable dielectric materials. In one embodiment, the insulating layer 108 and the dielectric layer 118 may be made of the same dielectric material. In another embodiment, the insulating layer 108 and the dielectric layer 118 may be made of different dielectric materials. The metal layer 120 may be made of a suitable metal, for example, titanium nitride, titanium, titanium aluminide, or any other suitable metals. In one embodiment, the metal layer 120 and the conductive layer 110 may be made of the same material. In another embodiment, the metal layer 120 and the conductive layer 110 may be made of different materials. The polysilicon layer 122 may be doped with a suitable n-type dopant, for example, arsenic, phosphorus, or antimony. The spacer structures 126 and the fin spacer structures 158 may be made of a suitable dielectric material, for example, silicon nitride, silicon oxynitride, silicon oxycarbonitride, or any other suitable dielectric materials. The epitaxial structures 142a to h and fin epitaxial structures 128a to f may be made of a suitable semiconductor material, for example, silicon germanium, silicon phosphide, or any other suitable semiconductor material. The silicide layers 132a to e may be made of a suitable silicide material, for example, titanium silicide, cobalt silicide, nickel silicide, or any other suitable silicide materials. The interlayer dielectric layer 136 may be made of a suitable dielectric material, for example, silicon dioxide, high density plasma undoped silicate glass, tetraethyl orthosilicate, a low dielectric constant material, or any other suitable dielectric material. The term "a low dielectric constant material" may refer to a dielectric material having a dielectric constant lower than 3.9. The contact electrodes 138a and b and gate contact electrode 138c may be made of a suitable metal, for example, tungsten, or any other suitable metals.

FIGS. 2A-B to 8A-D illustrate a fabrication process flow for the structure 100 shown in FIGS. 1A to 1E, according to some embodiments of the disclosure. FIG. 2A illustrates a top view of the structure 100 after the formation of the isolation structure 106 adjacent to the active layer 102c, according to an embodiment of the disclosure. The isolation structure 106 may be formed adjacent to side surfaces of the active layer 102c and in a substrate 102.

FIG. 2B illustrates a corresponding cross-sectional view of the structure 100 taken along section line X-X' of FIG. 2A, at an exemplary processing step according to an embodiment of the disclosure. Referring to FIG. 2B, a substrate 102 is provided, the substrate 102 may be a silicon on insulator substrate. The substrate 102 may include a semiconductor layer 102a, a buried oxide layer 102b over the semiconductor layer 102a and an active layer 102c over the buried oxide layer 102b. Isolation structures 106 may be formed in the substrate 102 by a material removal process, for example, by forming an opening in the substrate 102, through the active layer 102c, buried oxide layer 102b and into the semiconductor layer 102a by a conventional photolithography process followed by a wet or dry etch. The conventional photolithography process may include depositing a layer of photoresist material on a top surface of the active layer 102c followed by exposure and developing to form a suitable photoresist pattern. A wet etch or dry etch process may be used to remove portions of substrate 102 not covered by the photoresist pattern to form the opening. The photoresist pattern may subsequently be removed. A layer of a suitable dielectric material, for example, silicon dioxide, may be deposited in the opening and over a top surface of the active layer 102c. A suitable planarization process, for example, chemical mechanical planarization, may be used to remove portions of the silicon dioxide layer from the top surface of the active layer 102c, leaving behind the silicon dioxide layer in the opening, thereby forming the isolation structure 106.

FIG. 3A illustrates a top view of the structure 100 at a subsequent processing step, for example, after deposition of the insulating layer 108, the conductive layer 110, the barrier layer 112 and the fin material layer 116, according to an embodiment of the disclosure. Although not shown for simplicity, the insulating layer 108, the conductive layer 110, and the barrier layer 112 may be arranged below the fin material layer 116.

FIG. 3B illustrates a corresponding cross-sectional view of the structure 100 taken along section line X-X' of FIG. 3A, according to an embodiment of the disclosure. Referring to FIG. 3B, the insulating layer 108 may be deposited on the top surface of the active layer 102c and the isolation structure 106. The deposition of the insulating layer 108 may include depositing a layer of a suitable insulating material, for example, silicon dioxide, silicon nitride, high dielectric constant material, for example, hafnium oxide, aluminum oxide, or any other suitable dielectric materials. The conductive layer 110 may be deposited on a top surface of the insulating layer 108. The deposition of the conductive layer 110 may include depositing a layer of a suitable conductive material, for example, titanium nitride, titanium, titanium aluminide, or any other suitable conductive materials. In one embodiment, the barrier layer 112 may be deposited on a top surface of the conductive layer 110. In an alternative embodiment, the barrier layer 112 may be deposited on the top surface of the active layer 102c and the isolation structure 106. The deposition of the barrier layer 112 may include depositing a layer of a suitable dielectric material, for example, silicon dioxide, silicon nitride, or any other suitable dielectric materials. The insulating layer 108, conductive layer 110, and barrier layer 112 may be deposited by atomic layer deposition, physical vapor deposition, chemical vapor deposition or any other suitable deposition processes. The fin material layer 116 may be deposited on a top surface of the barrier layer 112. The deposition of the fin material layer 116 may include depositing a layer of a suitable semiconductor material, for example, polysilicon, or any other suitable semiconductor materials. The fin material layer 116 may be deposited by chemical vapor deposition, or any other suitable deposition processes.

FIG. 4A illustrates a top view of the structure 100, at a subsequent processing step, after the formation of the fins 116a, 116b and 116c and patterning of the insulating layer 108, the conductive layer 110, and the barrier layer 112, according to an embodiment of the disclosure. Referring to FIG. 4A, for simplicity, the insulating layer 108, the conductive layer 110, and the barrier layer 112 under the fins 116a to c are not shown. The formation of the fins 116a to c and patterning of the barrier stack are described in FIGS. 4B to 4D FIG. 4B illustrates a corresponding cross-sectional view of the structure 100 taken along section line X1-X1' of FIG. 4A, according to an embodiment of the disclosure. Referring to FIG. 4B, the formation of the fins 116a to c and patterning of the barrier stack may include a photolithography process followed by a wet or dry etch process. The photolithography process may be used to form suitable photoresist patterns on a top surface of the fin material layer 116. The wet etch or dry etch process may be used to remove portions of the fin material layer 116 and the barrier stack, through the barrier layer 112, conductive layer 110, and insulating layer 108, not covered by the photoresist patterns. The etching processes may leave behind another portion of the barrier stack and fin material layer 116 under the photoresist patterns. The photoresist patterns may subsequently be removed. The patterning process may remove a portion of the barrier stack, for example, the barrier layer 112, conductive layer 110 and insulating layer 108, and the fin material layer 116 from the top surface of the isolation structure 106.

FIG. 4C illustrates a corresponding cross-sectional view of the structure 100 taken along section line X2-X2' of FIG. 4A, according to an embodiment of the disclosure. Referring to FIG. 4C, the patterning process may expose the top surface of the active layer 102c laterally adjacent to the fins 116a to c.

FIG. 4D illustrates a corresponding cross-sectional view of the structure 100 taken along section line Y-Y' of FIG. 4A, according to an embodiment of the disclosure. Referring to FIG. 4D, the patterning process may expose side surfaces and top surfaces of the fins 116a to c and the top surface of the active layer 102c between the fins 116a and 116b and between the fins 116b and 116c. The patterning process may also expose side surfaces of the barrier layer 112, conductive layer 110 and insulating layer 108.

FIG. 5A illustrates a top view of the structure 100 at a subsequent processing step, after the formation of the dielectric layer 118 and deposition of the metal layer 120, according to an embodiment of the disclosure. Referring to FIG. 5A, the fins 116a to c are shown for clarity. The dielectric layer 118 under the metal layer 120 is not shown for simplicity.

FIG. 5B illustrates a corresponding cross-sectional view of the structure 100 taken along section line X1-X1' of FIG. 5A, according to an embodiment of the disclosure. Referring to FIG. 5B, in one embodiment, the dielectric layer 118 may be deposited on the top surface of the isolation structure 106 and side surfaces and top surface of the fin 116c, side surfaces of the barrier layer 112 and conductive layer 110. The deposition of the dielectric layer 118 may include depositing a layer of a suitable dielectric material, for example, silicon dioxide, silicon nitride, high dielectric constant materials, or any other suitable dielectric materials. In one embodiment, the dielectric layer 118 may be deposited by a suitable deposition process, for example, atomic layer deposition, physical vapor deposition, chemical vapor deposition or any other suitable deposition processes. In another embodiment, for example, the dielectric layer 118 may be thermally grown silicon oxide which may be selectively grown on side surfaces and top surface of the fin 116c. The metal layer 120 may be deposited on the top surface of the dielectric layer 118. The deposition of the metal layer 120 may include depositing a layer of a suitable metal, for example, titanium nitride, titanium, titanium aluminide, or any other suitable metals. The metal layer 120 may be deposited by a suitable deposition process, for example, atomic layer deposition, physical vapor deposition, chemical vapor deposition or any other suitable deposition processes.

FIG. 5C illustrates a corresponding cross-sectional view of the structure 100 taken along section line X2-X2' of FIG. 5A, according to an embodiment of the disclosure. Referring to FIG. 5C, the dielectric layer 118 may be formed on the top surface of the active layer 102c laterally adjacent to the fin 116a and the metal layer 120 may be deposited on the dielectric layer 118.

FIG. 5D illustrates a corresponding cross-sectional view of the structure 100 taken along section line Y-Y' of FIG. 5A, according to an embodiment of the disclosure. Referring to FIG. 5D, in one embodiment, the dielectric layer 118 may be deposited on side surfaces and top surfaces of the fins 116a to c, side surfaces of the barrier layer 112 and the conductive layer 110 and top surface of the active layer 102c laterally adjacent to the insulating layer 108 under the fins 116a to c. The metal layer 120 may be deposited over the dielectric layer 118. The dielectric layer 118 may separate the metal layer 120 from the conductive layer 110 below the fins 116a to c. In an alternative embodiment, the barrier layer 112 may be in direct contact with the top surface of the active layer 102c. The dielectric layer 118 may be deposited on the side surfaces and top surfaces of the fins 116a to c, side surfaces of the barrier layer 112 and top surface of the active layer 102c laterally adjacent to the barrier layer 112 under the fins 116a to c and the metal layer 120 may be formed over the dielectric layer 118. In yet another embodiment, the dielectric layer 118 may be thermally and selectively grown on the side surfaces and top surfaces of the fins 116a to c, and top surface of the active layer 102c laterally adjacent to the insulating layer 108 under the fins 116a to c. The metal layer 120 may be deposited over the dielectric layer 118 and on side surfaces of the barrier layer 112 and the conductive layer 110. The metal layer 120 may be in direct contact with the conductive layer 110.

Figure 6A:
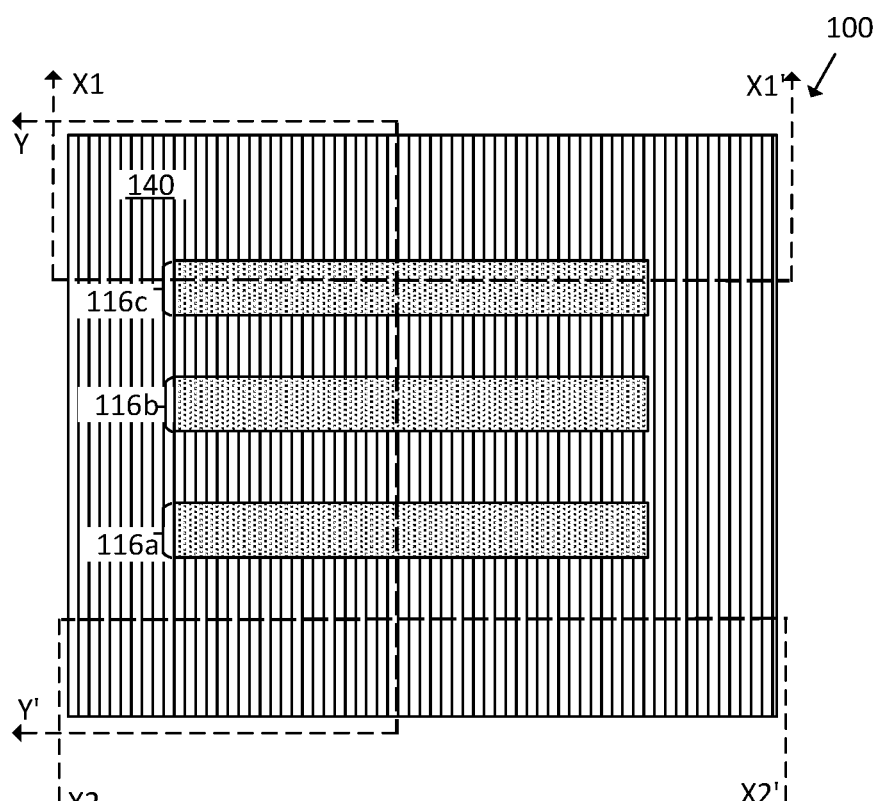

FIG. 6A illustrates a top view of the structure 100 at a subsequent processing step, after the deposition of the polysilicon layer 122 and hard mask layer 140, according to an embodiment of the disclosure. Referring to FIG. 6A, the fins 116a to c are shown for clarity. The polysilicon layer 122 may be deposited over the isolation structure 106, active layer 102c and fins 116a to c and the hard mask layer 140 may be deposited over the polysilicon layer 122. For simplicity, the polysilicon layer 122 under the hard mask layer 140 is not shown. The hard mask layer 140 may be made of silicon nitride. The polysilicon layer 122 and the hard mask layer 140 may be deposited by chemical vapor deposition or any other suitable deposition processes.

Figure 6B:
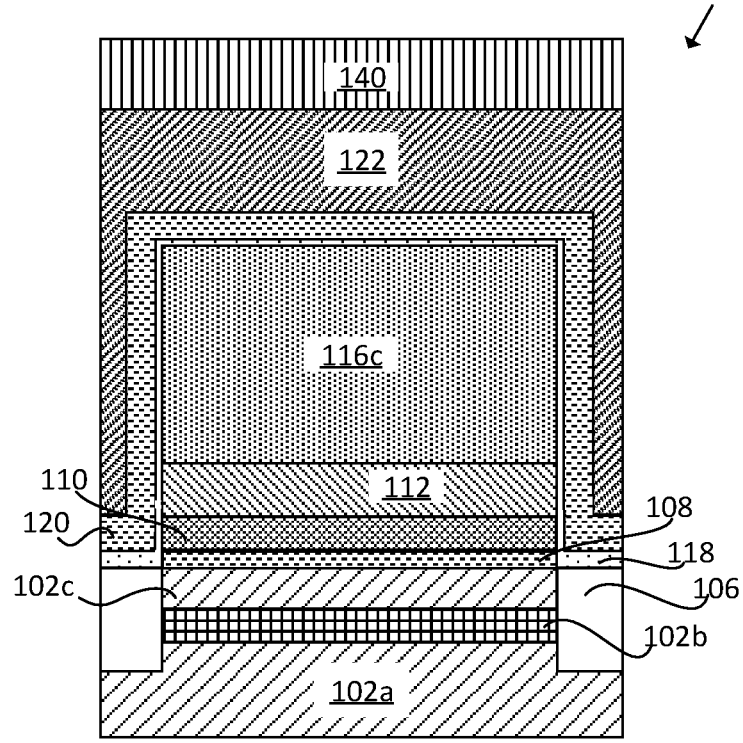

FIG. 6B illustrates a corresponding cross-sectional view of the structure 100 taken along section line X1-X1' of FIG. 6A, according to an embodiment of the disclosure. Referring to FIG. 6B, the polysilicon layer 122 may be deposited on the top surface and side surfaces of the metal layer 120 over the fin 116c and the isolation layer 106. A suitable planarization process, for example, chemical mechanical planarization, may be used to planarize a top surface of the polysilicon layer 122. The hard mask layer 140 may be deposited on the top surface of the polysilicon layer 122.

Figure 6C:
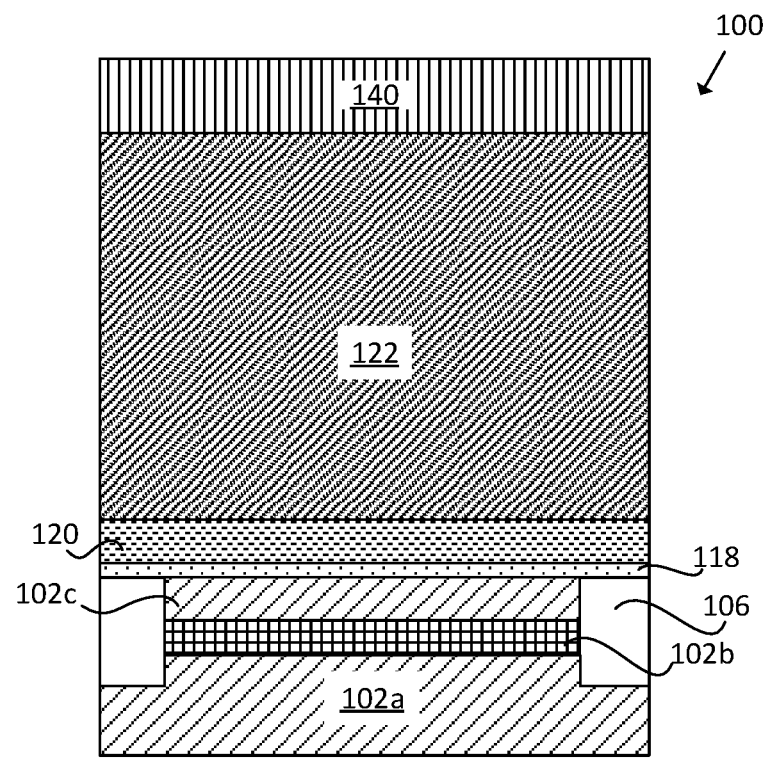

FIG. 6C illustrates a corresponding cross-sectional view of the structure 100 taken along section line X2-X2' of FIG. 6A, according to an embodiment of the disclosure. Referring to FIG. 6C, the polysilicon layer 122 may be deposited on the top surface of the metal layer 120 over the top surface of the active layer 102c laterally adjacent to the fin 116a.

Figure 6D:
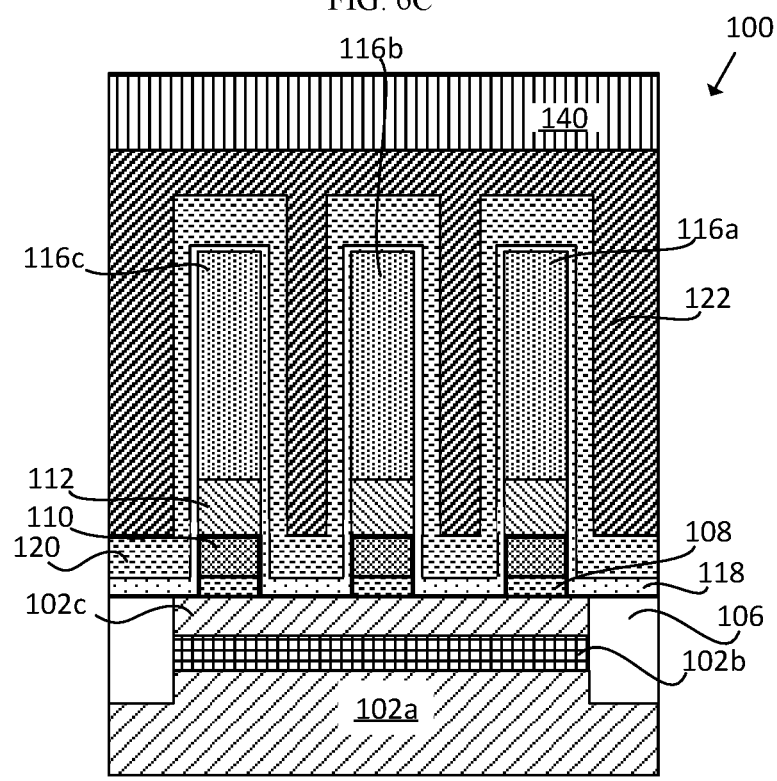

FIG. 6D illustrates a corresponding cross-sectional view of the structure 100 taken along section line Y-Y' of FIG. 6A, according to an embodiment of the disclosure. Referring to FIG. 6D, the polysilicon layer 122 may be deposited on the top surfaces and side surfaces of the metal layer 120 over the fins 116a to c. The polysilicon layer 122 may also be deposited on the top surface of the metal layer 120 arranged over the top surface of the active layer 102c laterally adjacent to the fins 116a to c.

FIG. 7A illustrates a top view of the structure 100 at a subsequent processing step, after the patterning of the hard mask layer 140, polysilicon layer 122, metal layer 120, and dielectric layer 118, according to an embodiment of the disclosure. The polysilicon layer 122, metal layer 120 and dielectric layer 118 may be referred to as a gate stack. Referring to FIG. 7A, for simplicity, the polysilicon layer 122, metal layer 120 and dielectric layer 118 under the hard mask layer 140 are not shown.

FIG. 7B illustrates a corresponding cross-sectional view of the structure 100 taken along section line X1-X1' of FIG. 7A, according to an embodiment of the disclosure. Referring to FIG. 7B, the patterning process of the hard mask layer 140 and the gate stack may include a photolithography process followed by a wet or dry etch. A photoresist layer may be deposited on the top surface of the hard mask layer 140 and patterned by the photolithography process to form a suitable photoresist pattern. A wet etch or dry etch process may be used to remove portions of the hard mask layer 140 and the gate stack, through the polysilicon layer 122, metal layer 120 and dielectric layer 118, not covered by the photoresist pattern. The etching processes may leave behind the hard mask layer 140 and the gate stack under the photoresist pattern. The photoresist pattern may subsequently be removed. The patterning process may expose the top surface of the fin 116c laterally adjacent to side surfaces of the hard mask layer 140 and polysilicon layer 122. Although not shown, the patterning process may expose the top surface of the fins 116a and 116b laterally adjacent to side surfaces of the hard mask layer 140 and polysilicon layer 122. The patterning process may expose the side surfaces of the fin 116c, barrier layer 112, conductive layer 110, and insulating layer 108, and the top surface of the isolation structure 106. Although not shown, the patterning process may expose the side surfaces of the fins 116a and 116b.

Figure 7C:
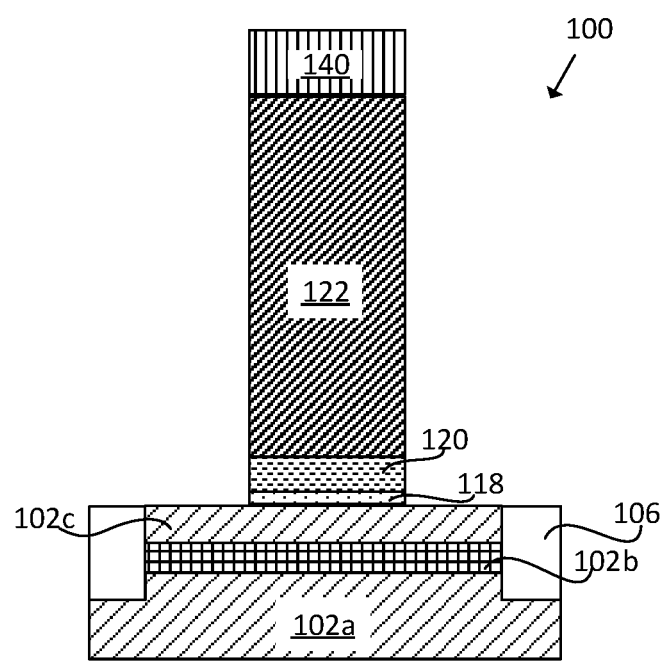

FIG. 7C illustrates a corresponding cross-sectional view of the structure 100 taken along section line X2-X2' of FIG. 7A, according to an embodiment of the disclosure. Referring to FIG. 7C, the patterning process may expose the top surface of the active layer 102c laterally adjacent to the polysilicon layer 122 and the fin 116a. Although not shown, the patterning process may expose the top surface of the active layer 102c laterally adjacent to the fins 116b and 116c.

FIG. 8A illustrates a top view of the structure 100 at a subsequent processing step, after the formation of spacer structures 126, the fin epitaxial structures 128a to f, and the epitaxial structures 142a to h, according to an embodiment of the disclosure. Referring to FIG. 8A, the spacer structures 126 may be formed along the side surfaces of the hard mask layer 140.

FIG. 8B illustrates a corresponding cross-sectional view of the structure 100 taken along section line X1-X1' of FIG. 8A, according to an embodiment of the disclosure. Referring to FIG. 8B, the spacer structures 126 may be formed on the first 148a and second 148b side surfaces of the polysilicon layer 122, side surfaces of the metal layer 120, and dielectric layer 118. Fin spacer structures 158 may be formed on the side surfaces of the fin 116c, barrier layer 112, conductive layer 110 and insulating layer 108. The spacer structures 126 and the fin spacer structures 158 may be formed simultaneously. For example, the formation of the spacer structures 126 and the fin spacer structures 158 may include depositing a layer of a suitable dielectric material, for example, silicon nitride, silicon oxynitride, silicon oxycarbonitride, or any other suitable dielectric materials, over the hard mask layer 140, polysilicon layer 122, metal layer 120, and dielectric layer 118, fin 116c, isolation layer 106, and active layer 102c. An anisotropic etching process may be used to remove the silicon nitride layer from the top surfaces of the isolation layer 106, active layer 102c, hard mask layer 140, and fin 116c, leaving behind the silicon nitride layer on side surfaces of the hard mask layer 140, and first 148a and second 148b side surfaces of the polysilicon layer 122. The silicon nitride layer may also be left behind on side surfaces of the metal layer 120, and dielectric layer 118 to form the spacer structures 126. The silicon nitride layer may also be left behind on side surfaces of the fin 116c, barrier layer 112, conductive layer 110 and insulating layer 108 to form fin spacer structures 158. The term "anisotropic etching" may refer to an etching process that is directional in nature. The fin epitaxial structures 128e and 128f may be formed on the top surface of the fin 116c laterally spaced from the first 148a and second 148b side surfaces of the polysilicon layer 122, respectively. The formation of the fin epitaxial structures 128e and 128f may include epitaxial growth of a suitable semiconductor material, for example silicon germanium, silicon phosphide, or any other suitable semiconductor material. The fin epitaxial structures 128e and 128f may be doped by a suitable n-type dopant, for example, arsenic, phosphorus, antimony, or any other suitable n-type dopants. The doping process may include implantation followed by annealing.

FIG. 8C illustrates a corresponding cross-sectional view of the structure 100 taken along section line X2-X2' of FIG. 8A, according to an embodiment of the disclosure. Referring to FIG. 8C, the epitaxial structures 142a and 142b may be formed on the top surface of the active layer 102c laterally spaced from the first 148a and second 148b side surfaces of the polysilicon layer 122, respectively. The formation of epitaxial structures 142a and 142b may be done simultaneously with the formation of the fin epitaxial structures 128e and 128f.

FIG. 8D illustrates a corresponding cross-sectional view of the structure 100 taken along section line Y2-Y2' of FIG. 8A, according to an embodiment of the disclosure. Referring to FIG. 8D, fin spacer structures 158 may also be formed on the first 146a and second 146b side surfaces of the fin 116a, and side surfaces of the fins 116b and 116c, barrier layer 112, conductive layer 110 and insulating layer 108. The epitaxial structure 142a may be formed on the top surface of the active layer 102c laterally spaced from the first side surface 146a. Epitaxial structure 142c may be formed on the top surface of the active layer 102c between the fins 116a and 116b. Epitaxial structure 142e may be formed between the fins 116b and 116c. Fin epitaxial structures 128a and 128c may be formed on the top surfaces of the fins 116a and 116b, respectively.

The fabrication process may continue to form the structure 100 illustrated in FIGS. 1B to 1E. To form the structure 100 shown in FIG. 1B, the hard mask layer 140 may be removed by a wet etch process using hot phosphoric acid, thereby exposing a top surface of the polysilicon layer 122. Silicide layers 132a to c may be formed on the top surfaces of the polysilicon layer 122, and fin epitaxial structures 128e and 128f, respectively. The formation of the silicide layers 132a to c may include depositing a layer of a suitable metal, for example, titanium, cobalt, nickel, or any other suitable metal over the polysilicon layer 122 and fin epitaxial structures 128e and 128f. The titanium may be annealed to form the silicide layers 132a to c. The unreacted titanium may subsequently be removed. A layer of a suitable dielectric material, for example, silicon dioxide, high density plasma undoped silicate glass, tetraethyl orthosilicate, a low dielectric constant material, or any other suitable dielectric material, may be deposited over the top surface of the isolation structure 106, fin 116c, silicide layers 132a to c, spacer structures 126 and fin spacer structures 158. A suitable planarization process, for example, chemical mechanical planarization, may be used to planarize the top surface of the silicon dioxide thereby forming the interlayer dielectric layer 136. Openings may be made in the interlayer dielectric layer 136 by patterning with a photolithography process followed by a wet or dry etch. A photoresist layer may be deposited on the top surface of the interlayer dielectric layer 136 and patterned by a photolithography process to form a suitable photoresist pattern. A wet or dry etch process may be used to remove portions of the interlayer dielectric layer 136 not covered by the photoresist pattern to form the openings, exposing portions of the silicide layers 132b and 132c. The photoresist layer may subsequently be removed. A layer of a suitable metal, for example, tungsten, may be deposited in the openings. A suitable planarization process, for example, chemical mechanical planarization, may be used to remove the tungsten from the top surface of the interlayer dielectric layer 136, leaving behind the tungsten in the openings, thereby forming the contact electrodes 138a and 138b.

To form the structure 100 shown in FIG. 1C, silicide layers 132d and 132e may also be formed over the epitaxial structures 142a and 142b, respectively. The silicide layers 132d and 132e may be formed simultaneously with the silicide layers 132a, 132b, and 132c. The interlayer dielectric layer 136 may also be formed over the silicide layers 132d and 132e. The contact electrodes 138a and 138b may also be formed over the silicide layers 132d and 132e, respectively.

To form the structure 100 shown in FIG. 1D, the gate contact electrode 138c may be formed by forming an opening in the interlayer dielectric layer 136 above the silicide layer 132a. A layer of photoresist may be deposited on the top surface of the interlayer dielectric layer 136 and patterned by a photolithography process to form a suitable photoresist pattern. A wet etch or dry etch process may be used to remove a portion of the interlayer dielectric layer 136 not covered by the photoresist pattern to form the opening, exposing a portion of the silicide layer 132a. The photoresist pattern may subsequently be removed. A layer of a suitable metal, for example, tungsten, may be deposited in the opening. A suitable planarization process, for example, chemical mechanical planarization, may be used to remove a portion of the tungsten from a top surface of the interlayer dielectric layer 136, leaving behind the tungsten in the opening.

To form the structure shown in FIG. 1E, silicide layers may be formed over epitaxial structures between the fins 116a and 116b, and between the fins 116b and 116c, and over fin epitaxial structures on the top surfaces of the fins 116a and 116b. The contact electrode 138a may be formed over the silicide layers and over the fin spacer structures 158 on side surfaces of the fins 116a to c.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the devices in any way. Rather, the above detailed description will provide those skilled in the art with a convenient road map for implementing an exemplary embodiment of the devices, it being understood that various changes may be made in the function and arrangement of elements and method of fabrication described in an exemplary embodiment without departing from the scope of this disclosure as set forth in the appended claims.

What is claimed:

1. A structure comprising:
    an active layer over a buried oxide layer, the active layer having a top surface, the top surface of the active layer having a first portion and a second portion;
    a barrier stack over the first portion of the top surface of the active layer, the barrier stack including a barrier layer, wherein the second portion of the top surface of the active layer is adjacent to the barrier stack;
    a fin spaced from the first portion of the top surface of the active layer by the barrier stack, the fin having a first side surface, a second side surface opposite to the first side surface and a top surface;
    a dielectric layer on the first side surface, the second side surface and the top surface of the fin, and the second portion of the top surface of the active layer; and
    a metal layer over the dielectric layer.

2. The structure of claim 1, wherein the barrier stack further comprises:
    an insulating layer; and
    a conductive layer over the insulating layer, wherein the insulating layer and the conductive layer are below the barrier layer.

3. The structure of claim 1, further comprising:
    a first epitaxial structure arranged on a third portion of the top surface of the active layer laterally spaced from the first side surface of the fin.

4. The structure of claim 3, further comprising:
    a first fin epitaxial structure arranged on the top surface of the fin.

5. The structure of claim 4, further comprising:
    a polysilicon layer over the metal layer.

6. The structure of claim 5, wherein the first epitaxial structure is arranged laterally spaced from a first side surface of the polysilicon layer.

7. The structure of claim 6, wherein the first fin epitaxial structure is arranged laterally spaced from the first side surface of the polysilicon layer.

8. The structure of claim 3, further comprising:
    a fin spacer structure on the first side surface of the fin, wherein the fin spacer structure separates the fin from the first epitaxial structure.

9. The structure of claim 4, further comprising:
    a contact electrode over the first epitaxial structure and the first fin epitaxial structure, wherein the contact electrode forms a continuous structure.

10. The structure of claim 1, wherein the dielectric layer is arranged on a side surface of the barrier layer.

11. The structure of claim 10, wherein the metal layer over the fin and over the second portion of the top surface of the active layer is a continuous structure.

12. The structure of claim 10, wherein the metal layer is arranged on the dielectric layer on the side surface of the barrier layer.

13. The structure of claim 2, wherein the metal layer is in direct contact with the conductive layer.

14. The structure of claim 6, further comprising:

a second epitaxial structure arranged on a fourth portion of the top surface of the active layer, wherein the second epitaxial structure is laterally spaced from the first side surface of the fin and a second side surface of the polysilicon layer.

15. A structure comprising:

an active layer over a buried oxide layer, the active layer having a top surface, the top surface of the active layer having a first portion and a second portion;

a barrier stack over the first portion of the top surface of the active layer, the barrier stack including a conductive layer and a barrier layer over the conductive layer, the conductive layer having a first side surface and a second side surface opposite to the first side surface, wherein the second portion of the top surface of the active layer is adjacent to the barrier stack;

a fin spaced from the first portion of the top surface of the active layer by the barrier stack, the fin having a first side surface, a second side surface opposite to the first side surface and a top surface;

a dielectric layer on the first side surface of the fin, the second side surface of the fin and the top surface of the fin, the first side surface of the conductive layer, the second side surface of the conductive layer, and the second portion of the top surface of the active layer; and a gate metal layer over the dielectric layer.

16. The structure of claim 15, further comprising:

a first epitaxial structure arranged on a third portion of the top surface of the active layer laterally spaced from the first side surface of the fin.

17. The structure of claim 16, further comprising:

a first fin epitaxial structure arranged on the top surface of the fin.

* * * * *